United States Patent [19]

Jacoby et al.

[11] Patent Number: 5,105,336

[45] Date of Patent: Apr. 14, 1992

[54] MODULAR MULTILEVEL ELECTRONIC CABINET

[75] Inventors: Eliot G. Jacoby, Glenside; Walter S. Zaharchuk, Macungie; Zalman A. Liss, Allentown; Denis P. Darragh, Allentown; Dat V. Ngo, Allentown, all of Pa.

[73] Assignee: Lutron Electronics Co., Inc., Coopersburg, Pa.

[21] Appl. No.: 630,724

[22] Filed: Dec. 20, 1990

Related U.S. Application Data

[63] Continuation of Ser. No. 79,227, Jul. 29, 1987, abandoned, which is a continuation of Ser. No. 916,882, Oct. 9, 1986, abandoned, which is a continuation of Ser. No. 808,345, Dec. 12, 1985, abandoned, which is a continuation of Ser. No. 603,615, Apr. 25, 1984, abandoned.

[51] Int. Cl.⁵ ............................................. H05K 7/20
[52] U.S. Cl. ...................................... 361/383; 361/379
[58] Field of Search ............... 357/81; 174/15.1, 16.1; 165/80; 361/382-384, 395, 399, 379

[56] References Cited

U.S. PATENT DOCUMENTS 2,471,011  5/1949  Shapiro .................................. 361/383
4,336,568  6/1982  Mitchell ................................ 361/386

FOREIGN PATENT DOCUMENTS 712991  1/1980  U.S.S.R. ................................ 361/383

OTHER PUBLICATIONS

Uninterruptible Modular Air Cooled Systems, IBM Tech. Discl. Bull. vol. 15, No. 12, 5/73 p. 3654, CHU. Ventilation System—Systems, IBM Tech. Discl. Bull. vol. 17, No. 9, 2/75, pp. 2529, 2530, Hammer.

Primary Examiner—Gerald P. Tolin
Attorney, Agent, or Firm—Ostrolenk, Faber, Gerb & Soffen

[57] ABSTRACT

An electronic cabinet is described which contains both control circuits containing heat producing components and a plurality of circuit breakers. The control circuits and the circuit breakers are located inside the cabinet with heat dissipating fins being located outside of the cabinet in a heat dissipating chimney. Air moves through the chimney by convection and cooperates with the heat dissipating fins to dissipate most of the heat generated by the heat-generating components of the control circuits. Openings are provided in the cabinet to permit cooling air to pass through the interior of the cabinet and over the control circuit components. These two paths of cooling air cooperate to reduce the temperature in the cabinet to a sufficient level to permit the circuit breakers to be located in the same chamber as the control circuits.

14 Claims, 3 Drawing Sheets

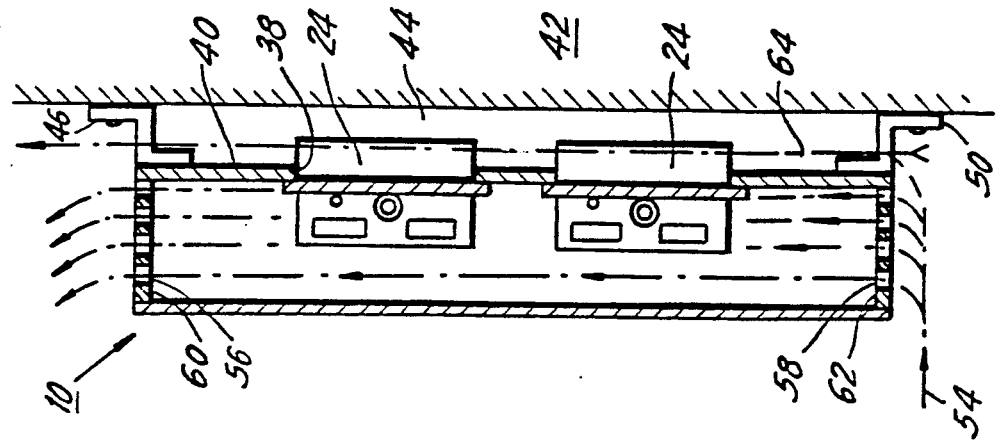
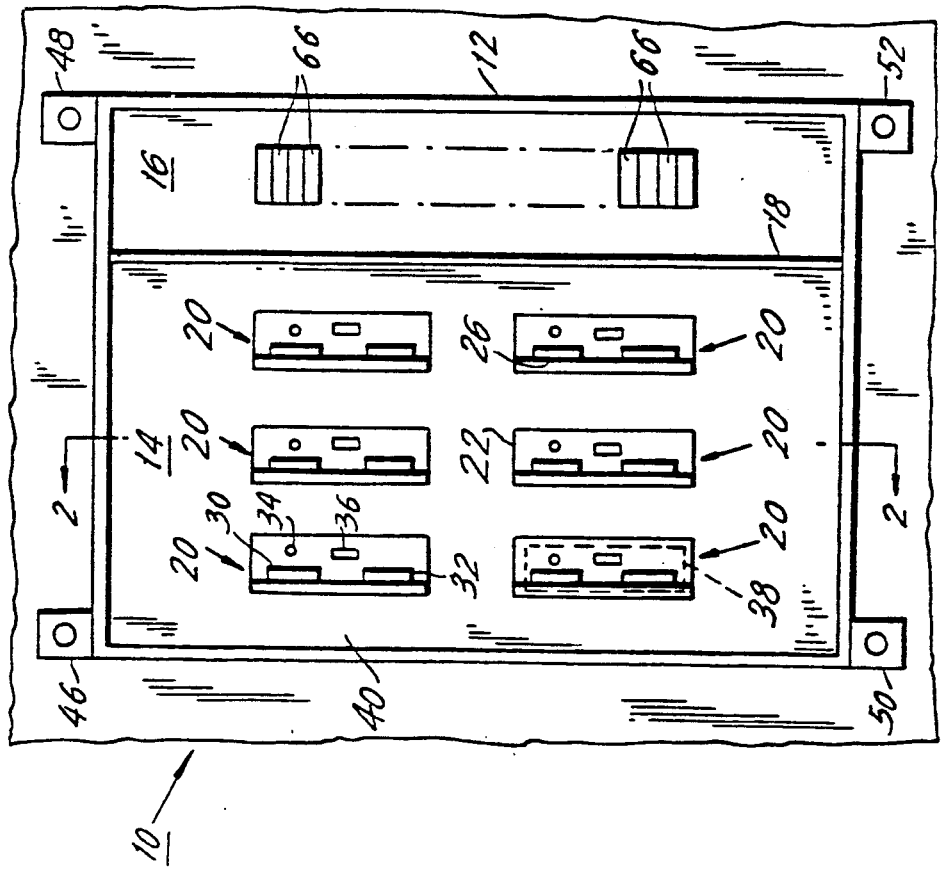

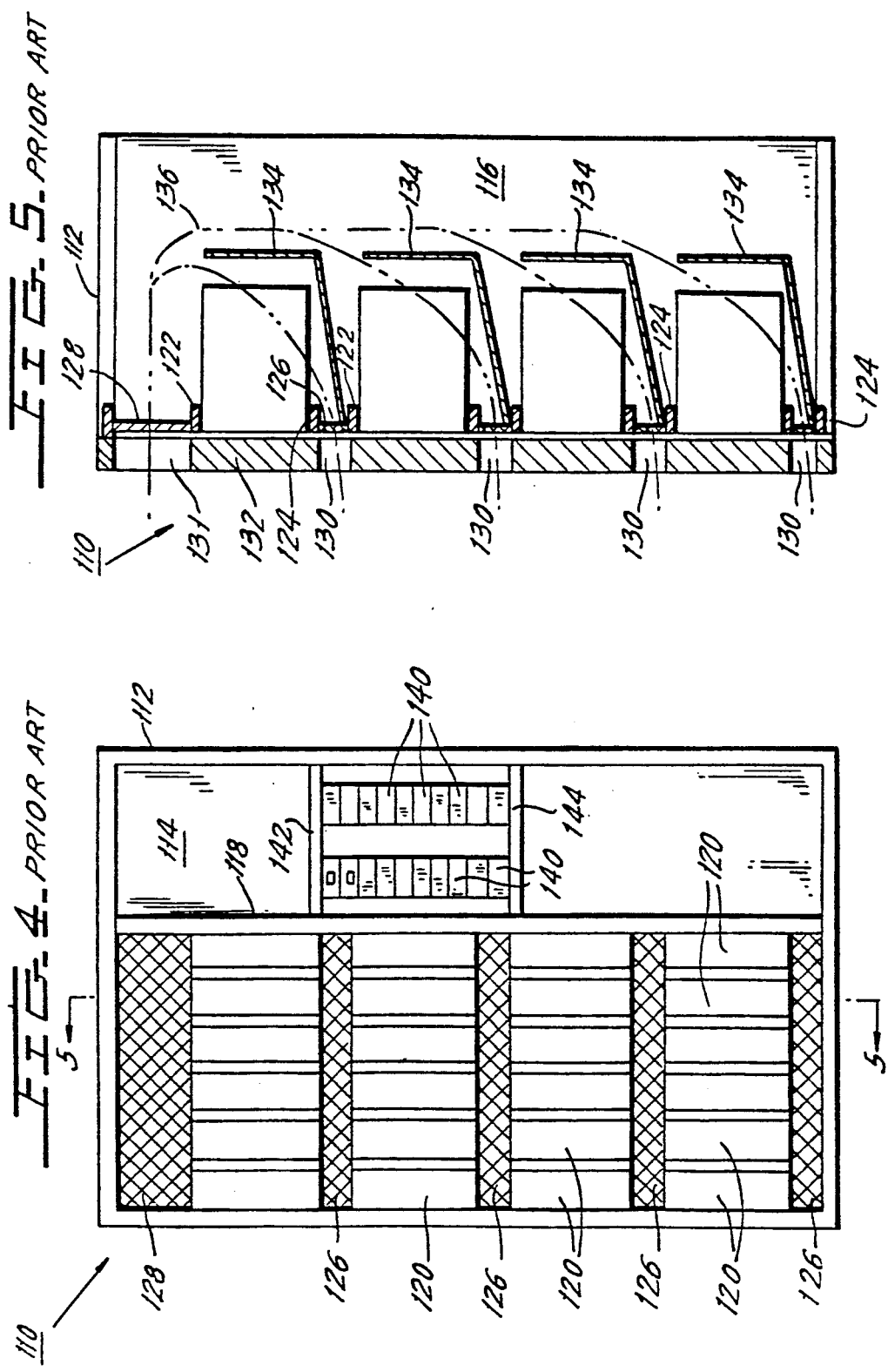

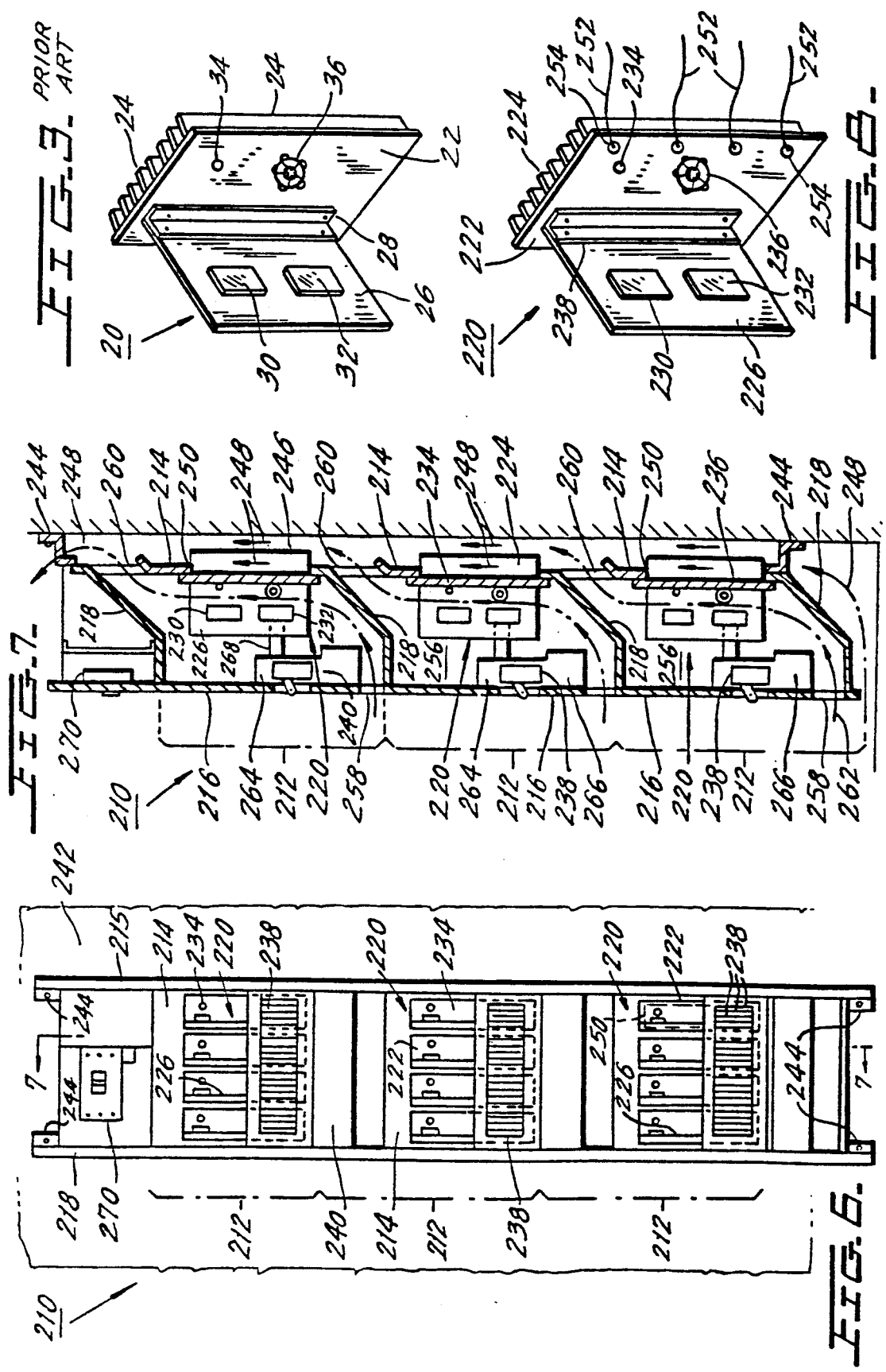

MODULAR MULTILEVEL ELECTRONIC CABINET

BACKGROUND OF THE INVENTION

Related Applications

This is a continuation of application Ser. No. 07/079,227, filed on July 29, 1987, now abandoned; which is a continuation of application Ser. No. 916,882, filed Oct. 9, 1986, now abandoned, which is a continuation of application Ser. No. 808,345, filed Dec. 12, 1985, now abandoned; which is a continuation of application Ser. No. 603,615, filed Apr. 25, 1984, now abandoned.

The present invention is directed towards an electronic cabinet and, more particularly, a modular multilevel electronic cabinet which contains high power heat-producing components, such as triacs, circuit breakers and the like, which are cooled by natural convection; and low power non-heat producing components, such as integrated circuits, capacitors and the like, which must be isolated from the heat-producing components.

The high power components carry relatively high currents (typically 10 to 40 amps) at high voltages while the low power components carry relatively low currents (typically substantially less than one amp) at low voltages. For safety reasons, the circuit breakers must be physically isolated from the control circuits and the surrounding environment. The control circuits must also be thermally isolated from the circuit breakers. The control circuits usually include power control elements, such as triacs, which generate a substantial amount of heat (typically between 10 and 60 watts). Since the circuit breakers are themselves a heat source, they must be thermally isolated from other heat producing elements to prevent heat from those elements being added to the heat generated by the circuit breaker which might result in tripping at current levels substantially below the rated values of the circuit breakers.

In order to physically and thermally isolate the control circuits from the breakers, the prior art cabinets are divided into two compartments, one of which houses a plurality of heat generating control circuits, the other of which houses the circuit breakers. In the known cabinets, the control circuit and circuit breaker compartments are spaced laterally within the cabinet. For example, the control circuits will be located in a first compartment located on the left-hand side of the cabinet while the circuit breakers will be located in a separate, second compartment located on the right-hand side of the cabinet. The control circuits are typically mounted in several horizontally extending rows which are vertically spaced from one another in the first compartment and are cooled by cool air which enters the bottom of the compartment and exits the top of the compartment by convection. In some cabinets, a separate air intake, extending from the front cover of the cabinet, will be provided at the bottom of each row of control circuits and baffling may be provided to prevent hot air, rising from a lower row of control circuits, from heating an upper row of control circuits. Since the circuit breakers are located in a separate compartment located laterally of the first compartment, and since heat convection is upward through the first compartment (and laterally of the second compartment), the heat generated by the control circuits does not have a substantial effect on the ambient air in the second compartment and will not adversely affect the operation of the circuit breakers.

While locating the circuit breaker compartment laterally of the control circuit compartment ensures that the circuit breakers will be physically and thermally isolated from the control circuits, it adds substantially to the width of the electronic cabinet. This is highly undesirable since electronic cabinets of the type to which the present invention applies are often installed in utility corridors or closets where horizontal wall space (cabinet width) is quite limited. Another drawback resulting from the fact that the circuit breakers are located in a compartment spaced laterally from the control circuit is that the circuit breaker must be connected to the control circuits by a fairly complex wiring harness which must be uniquely designed each time the number or configuration of the control circuits is changed (while the cabinet will have space for a predetermined number of control circuits, less than the full complement may be used and different types of control circuits may be used at each location).

BRIEF DESCRIPTION OF THE PRESENT INVENTION

In order to overcome the foregoing drawbacks of the prior art, the present invention places the circuit breakers in the control circuit compartment and in front of, rather than laterally of, the control circuits. The present invention also provides first and second cooling paths, the first of which is remote from the circuit breakers and cooperates with heat dissipating fins to dissipate most of the heat generated by the heat-generating components. The second cooling path which is adjacent the circuit breakers, removes the remaining heat which has not been dissipated by the first path.

In accordance with the foregoing, the electronic cabinet comprises:

- a main chamber including a front wall, side walls and a back wall;
- at least one control circuit module including a plurality of circuit components and a plurality of heat fins, the circuit components including at least one heat producing element which is thermally coupled to said heat fins, each of the control circuit modules being coupled to the rear wall at a respective location on the rear wall with the circuit components located inside the chamber and the heat fins located outside the chamber;
- an air intake opening formed in the front wall and an air exhaust opening formed in the rear wall, the relative location of the air intake opening, the air exhaust opening and the circuit components being such that cool air enters the chamber through the air intake opening, passes over the circuit components and exits the chamber through the air exhaust opening by natural convection as the air in the chamber is heated by the at least one heat producing element;
- at least one circuit breaker located in the chamber in front of the control circuit module and adjacent the front wall; and
- a circuit breaker bracket enclosing the at least one circuit breaker.

Additionally, the cabinet may include a chimney defined by the back wall and a second structure located outside the chamber and spaced from the back wall (typically the wall of the utility closet upon which the cabinet is mounted). The heat fins will be located in the chimney and the chimney would have a chimney air intake opening located below the heat fins so as to permit cooling air to flow through the chimney due to natural connection once the heat fins are heated by the at least one heat producing element.

Further, the cabinet is constructed so as to allow the vertical stacking of the cabinet structures to form a complete modular enclosure structure.

BRIEF DESCRIPTION OF THE DRAWINGS

For the purpose of illustrating the invention, there is shown in the drawings an embodiment which is presently preferred, it being understood, however, that the invention is not limited to the precise arrangements and instrumentalities shown.

FIG. 1 is a front view of a first prior art electronic cabinet with its front cover removed.

FIG. 2 is a cross-sectional view of the cabinet of FIG. 1 taken along lines 2—2.

FIG. 3 is a perspective view of one of the control circuits located in the cabinet of FIG. 1.

FIG. 4 is a front view of a second prior art electronic cabinet.

FIG. 5 is a cross-sectional view of the cabinet of FIG. 4 taken along lines 5—5.

FIG. 6 is a front view of the electronic cabinet of the present invention with the front cover removed.

FIG. 7 is a cross-sectional view of the cabinet of FIG. 6 taken along lines 7—7.

FIG. 8 is a perspective view of a control circuit in accordance with the presently preferred embodiment of the present invention.

DETAILED DESCRIPTION OF THE INVENTION

Referring now to the drawings wherein like numerals indicate like elements, there is shown in FIGS. 1 and 2 a prior art electronic cabinet sold by Lutron Electronics Co., Inc., the assignee of the present invention. The prior art electronic cabinet 10 includes an outer case 12 which is divided into two separate laterally spaced compartments 14, 16 by a dividing wall 18. The compartment 14 houses a plurality of electronic control circuit modules 20 which include circuit elements which are typically configured to operate as a dimmer control circuit. As best shown in FIG. 3, control circuit module 20 includes a metallic base plate 22 having a plurality of metallic heat fins 24 extending rearwardly therefrom. An electronic circuitboard 26 is mounted at right angles to the base plate 22 by an angle bar 28 which is secured to the base plate 22. A plurality of electronic components, shown schematically as 30 and 32, are attached to the circuitboard 26 and are electrically connected to each other by an appropriate circuit pattern (not shown) as is well known in the art. A voltage control device 34 (such as a triac) is electrically connected to the components on circuitboard 26 (by leads not shown) and is mounted directly on the base plate 22. A choke 36 is also mounted on the base plate 22 and is connected to appropriate components on the circuitboard 26. The voltage control device 34 and choke 36 cooperate with the components 30, 32 to form a dimmer circuit. The voltage control device 34 and choke 36 generate approximately 90% of the heat generated by control circuit module 20. Since these elements are directly connected to the metallic base plate 22, they are in thermal contact with the heat fins 24 with the result that the heat fins 24 can dissipate most of the heat created by these elements.

Referring to FIGS. 1 and 2, the heat fins 24 of each of the control circuit modules 20 extend through a respective opening 38 formed in the back plate 40 defining part of the case 12. The back plate 40 is spaced from a support wall 42 to which the cabinet 10 is mounted by four brackets 46-52 and associated mounting screws (unnumbered). The back plate 40 and support wall 42 cooperate to form a heat-dissipating chimney 44 which defines a first path of cooling air (indicated by dotted line 64) which cools the heat fins 24 and thereby dissipates the heat generated by the voltage control devices 34 and the chokes 36. If additional cooling is necessary, slits 56 and 58 may be formed in the top and bottom walls 60, 62, or in the top part of the back plate 40 and in the bottom wall, 62, respectively, of the case 12 to form a second path of cooling air (indicated by dotted line 54).

As best shown in FIG. 1, a plurality of circuit breakers 66 are housed in the compartment 16. Each of the control circuit modules 20 will be connected to a respective set of the circuit breakers 66 as well as to a main power line. By way of example, a respective set of four circuit breakers 66 may be connected to each control circuit module 20. A main power line will run as an input to each control circuit module 20 which, in turn, will have three outputs leading to respective circuit breakers of the set of circuit breakers associated with that control circuit. The output of each circuit breaker 66 will, in turn, lead to one or more electric components (e.g., lamps) being controlled by that respective control circuit module 20.

The placement of the circuit breakers 66 in the compartment 16 located laterally with respect to the control circuit compartment 14 has two primary drawbacks. Initially, it adds substantially to the width of the electronic cabinet which is highly undesirable since cabinets of this type are often installed in utility corridors or closets where horizontal wall space (cabinet width) is quite limited. In addition, the provision of the circuit breakers 66 in the laterally spaced compartment 16 makes it necessary to utilize a fairly complex harness for connecting the circuit breakers to the control circuits and the harness must be uniquely designed each time the number or configuration of control circuits (i.e., the number or type of circuits) is changed. This is best understood by way of example.

In the embodiment illustrated in FIGS. 1 and 2, the cabinet 10 is adapted to hold six control circuit modules 20 and all six control circuits have been used. In practical applications, the customer will often require less than six control circuits. Additionally, it is not always necessary for each control circuit module 20 to be connected to four separate circuit breakers 66. For example, if a given control circuit module 20 is used to control a single lamp, only a single circuit breaker 66 is required. The particular connections between the control circuit modules 20 and the circuit breakers 66 will also vary depending upon the type of control circuit module 20 being used. For example, if a control circuit module 20 which operates as an incandescent dimmer is used, one type of connection is required while a different type of connection is required if the control circuit module 20 operates as a fluorescent dimmer.

As should be apparent from the foregoing, the particular interconnection between the control circuit modules 20 and the circuit breakers 66 will depend on the number and type of control circuit module used. For this reason, it is necessary to design a custom harness for each different configuration used. This increases the manufacturing costs and complicates the wiring operations. As will be described in greater detail below, the present invention obviates this requirement thereby significantly reducing the manufacturing costs and simplifying the wiring operations associated with the present invention.

A second prior art electronic component cabinet, manufactured by Decor Electronics Corporation under the product designation EDMC-24 is shown in FIGS. 4 and 5. This prior art cabinet 110 also includes an outer case 112 which is divided into first and second compartments 114, 116 by a dividing wall 118. A plurality of electronic control circuit modules 120 are mounted on different levels within the compartment 116. While the control circuit modules 120 are shown as blank boxes for simplicity, it will be understood that these control circuit modules include the necessary electronic components including heat generating components such as a triac and a choke as well as appropriate heat fins.

The control circuit modules 120 are each mounted to a respective pair of horizontal support bars 122, 124 as best shown in FIG. 5. A grate 126 is also supported by adjacent support bars 122, 124 such that a respective grate is located immediately below each electronic control circuit module 120. Each grate 126 cooperates with a respective opening 130 in the front cover 132 of cabinet 110 to provide a cool air inlet immediately below each control circuit module 120. A plurality of baffles 134 are also provided to ensure an airflow in the direction indicated by lines 136. As shown in FIG. 5, the air enters the compartment 116 via the openings 130 and travels past the respective electronic control circuit modules 120 into the rear of compartment 116. The hot air rises by convection and exits the top of compartment 116 via a grate 128 and an opening 131 formed in the front cover 132. This ensures that cool air is provided to each control circuit module 120 and that hot air which had been heated by a lower control circuit module 120 is guided away from the electronic control circuit modules 120 above that control circuit module. This structure provides a relatively inefficient cooling of the control circuit modules 120 because exhaust air must make a sharp turn to exit the front of the cabinet. Furthermore, there is no location in the compartment 116 which is sufficiently cool to permit circuit breakers to be located therein without adversely affecting the operation of the circuit breakers. For this reason, the circuit breakers 140 are located in the separate compartment 114 as best shown in FIG. 4. The circuit breaker 140 are supported in two rows between horizontal support brackets 142, 144. Since the circuit breakers 140 are located in the separate compartment 114, the cabinet 110 exhibits the drawbacks with respect to the width of the cabinet and the need for a specially designed harness which was described in some detail with respect to the prior art cabinet illustrated in FIGS. 1 and 2.

The present invention overcomes the drawbacks of the prior art cabinets by placing the circuit breakers in the same chamber as the control circuits and by providing an airflow which will ensure that the temperature surrounding the circuit breakers is sufficiently low to avoid adversely affecting the operation of the circuit breakers.

Referring now to FIGS. 6-8, the presently preferred embodiment of the invention will be described. In this embodiment, the cabinet 210 is divided into a plurality of sections 212 each defined by a rear wall 214, a pair of side walls 215, a front cover 216, a pair of baffles 218, a plurality of electronic control circuit modules 220, a plurality of circuit breakers 238 and a breaker bracket 240, which encloses the circuit breakers 238. Front cover 216, rear wall 214, baffles 218 and side walls 215 cooperate to define a main chamber 256 in which the circuit components of control circuit modules 220 and the circuit breakers 238 are housed and through which cooling air flows by convection. While three sections 212 are shown, a greater or lesser number can be used as required.

The rear wall 214 is preferably coupled to a support wall 242 by four brackets 244 and associated mounting screws (unnumbered) so as to form a chimney 246 which permits cooling air to flow from the bottom of cabinet 210 up through the top of the chimney 246 as indicated by arrows 248. While rear wall 214 is shown as being attached to a support wall 242, the cabinet 210 may alternately be connected to a rear cover plate or to the back of a second cabinet 210 so as to form the chimney 246.

As best shown in FIG. 7, a plurality of openings 250 are formed in rear wall 214 to receive respective control circuit modules 220. As best shown in FIG. 8, control circuit module 220 is substantially identical to control circuit module 20 illustrated in FIG. 3. Those elements in FIG. 8 which are identical to the elements of FIG. 3 are indicated by like numerals with the addition of the number 200. Thus, fin 224 of FIG. 8 corresponds to FIG. 24 of FIG. 3. The primary difference between control circuit module 220 of FIG. 8 and control circuit module 20 of FIG. 3 resides in the provision of a plurality of pigtails 252 connected to associated terminals 254. The terminals 254 are supported on but electrically insulated from the metallic base plate 222 and are electrically connected to respective outputs of the control circuit module 220. These outputs control the operation of respective electric circuits to be controlled by control circuit module 220. For example, if control circuit module 220 is a dimmer control circuit, each pigtail 252 will be connected to an associated group (one or more) of lamps whose operation is to be controlled by the dimmer control circuit forming part of module 220. As will be described in further detail below, each pigtail 252 is connected to the electric components being controlled via a respective circuit breaker 238. The provision of the pigtails 252 and the spatial relationship between each control circuit module 220 and its associated circuit breakers 238 obviate the need for a specially designed harness for connecting the control circuit moduless 220 to the circuit breakers 238. This significantly simplifies the process for manufacturing and the cost of cabinet 210 relative to the prior art cabinets.

Referring again to FIGS. 6 and 7, the heat fin 224 of each control circuit 220 extends through its respective opening 250 with the metallic base plate 222 lying flush against the portion of the front surface of the rear wall 214 lying adjacent the opening 250. The support plate 222 is secured to the rear wall 214 by any appropriate means. In this orientation, the heat fins 224 extend into the chimney 246 while the circuit components 230, 232 on circuit-board 226, as well as the choke 236, extend into the main chamber 256 of the section 212 in which the control circuit module 220 is located. The chimney 246 defines the main heat dissipating chamber since it withdraws heat from the heat fins 224 which are in thermal contact with the two primary heat-generating elements: the voltage control device 234 and the choke 236. In a typical application, the temperature in chimney 246 will be in the range of 30° to 50° C. The main chamber 256 defines a second heat dissipating path which withdraws the small amount of heat generated by circuit components 230, 232 and also serves to further cool the choke 236. It has been found that by adding this additional airflow, the temperature in chamber 256 is decreased by approximately 10° C. The airflow through chamber 256 is from an air intake opening 258 formed in the front cover 216 adjacent the lower baffle 218 defining the bottom of each section 212 and an air exhaust opening 260 formed in the rear wall 214 adjacent the upper baffle 218 of each section 212. This permits air to enter chamber 256 from the front of the cabinet 210, to flow up past the circuit-board 226 and choke 236 and to flow out of the chamber 256 into the chimney 246, as indicated by arrows 262. This airflow significantly reduces the temperature in chamber 256 and thereby makes it possible to house the circuit breakers 238 in the chamber 256.

As best shown in FIG. 7, the breaker brackets 240 each include an upper section 264 in which the circuit breakers are housed and an enlarged lower section 266 through which the cable connections both from the main power supply (which enters cabinet 210 through a main breaker 270) and the individual pigtails 252 of each of the electronic control circuit modules 220 extend to the individual circuit breakers 238. The breaker brackets 240 are each supported from the back wall by a support bar 268. If desired, the breaker bracket 240 may also be supported from the side walls 215. The breaker bracket should not be supported from the front wall 264 since the front wall is preferably removable to gain easy access to the breakers.

As best shown in FIG. 6, four circuit breakers 238 are located in front of each module 220 so that the pigtails 252 associated with that module can easily be connected to the appropriate circuit breakers 238. This obviates the need for a complex harness and significantly simplifies wiring operations. The circuit breakers 238 are supported in bracket 240 by appropriate support bars (not shown).

While control circuit modules 220 have been described as dimmer circuits, it should be understood that any control circuit having heat-generating elements could be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. An electronic cabinet, comprising:
   a main chamber including a front wall and a back wall;
   a chimney defined by said back wall and a second structure located outside said chamber and spaced from said back wall;
   at least one control circuit module including a plurality of circuit components and a plurality of heat fins, said circuit components including at least one heat-producing element which is thermally coupled to said heat fins, each of said control circuit modules being coupled to said back wall at a respective location on said back wall with said circuit components located inside said chamber and said heat fins located inside said chimney;
   an air intake opening formed in said front wall and an air exhaust opening formed in said back wall, the relative location of said intake opening, said air exhaust opening and said circuit components being such that cool air enters said chamber through said air intake opening, passes over said circuit components and exits said chamber through said air exhaust opening by natural convection as the air in said chamber is heated by said at least one heat-producing element; and
   said chimney having a chimney air intake opening located below said heat fins and a chimney exhaust opening located above said heat fins so as to permit cooling air to flow through said chimney due to natural convection once said heat fins are heated by said at least one heat-producing element;
   further including at least one circuit breaker located in said chamber in front of said control circuit module and adjacent said front wall; and
   a circuit breaker bracket enclosing said at least one circuit breaker.

2. The electronic cabinet of claim 1, wherein said at least one circuit breaker includes a plurality of sets of circuit breakers, the number of said sets being equal to the number of said control circuit modules, each said set of circuit breakers being located in front of and adjacent to a respective one of said control circuit modules such that each control circuit module has a respective set of circuit breakers associated therewith.

3. The electronic cabinet of claim 2, wherein each said control circuit module includes at least one pigtail lead extending therefrom to a respective one of said circuit breakers forming part of the set of circuit breakers associated therewith.

4. A modular electronic cabinet having a plurality of cabinet sections located one atop the other, each said cabinet section comprising:
   a substantially enclosed main chamber including a front wall, a back wall, a pair of side walls, and top and bottom walls;
   a chimney defined by said back wall and a second wall located outside said chamber and spaced from said back wall;
   at least one control circuit module including a plurality of circuit components and a plurality of heat fins, said circuit components including at least one heat-producing element which is thermally coupled to said heat fins, each of said control circuit modules being coupled to said back wall at a respective location on said back wall with said circuit components located inside said chamber and said heat fins located inside said chimney;
   an air intake opening formed in said front wall and an air exhaust opening formed in said back wall, the relative location of said air intake opening, said air exhaust opening and said circuit components being such that cool air enters said chamber through said air intake opening, passes over said circuit components and exits said chamber through said air exhaust opening by natural convection as the air in said chamber is heated by said at least one heat-producing element;
   said chimney having a chimney air intake opening located below said heat fins and a chimney exhaust opening located above said heat fins so as to permit cooling air to flow through said chimney due to natural convection once said heat fins are heated by said at least one heat-producing element;

at least one circuit breaker located in said chamber in front of said control circuit module and adjacent said front wall; and a circuit breaker bracket enclosing said at least one circuit breaker.

5. The electronic cabinet of claim 4, wherein said chimney of each cabinet section cooperates with the chimneys of adjacent cabinet sections to form a single composite chimney.

6. The electronic cabinet of claim 4, wherein top and bottom walls of adjacent sections are formed by a common wall.

7. The electronic cabinet of claim 4, wherein each said control circuit module includes a generally planar, thermally conductive base plate having first and second opposed sides, said circuit components extending from one side of said base plate, said heat fins extending from said second side of said base plate, and wherein a plurality of control circuit module receiving openings are formed in said back wall of each said cabinet section, said base plate of each of said control circuit modules associated with a given cabinet section being connected to a respective portion of a front surface of said back wall of that cabinet section with said heat fins of each said control circuit module extending through a respective said control circuit module-receiving opening and into said chimney and said circuit components of each said control circuit module extending into said chamber.

8. The electronic cabinet of claim 7, wherein each said control base plate entirely covers that said control circuit module opening through which its associated heat fins extend.

9. The electronic cabinet of claim 4, wherein for each said cabinet section said air intake opening is formed at the bottom of said front wall adjacent said bottom baffle and said air exhaust opening is formed at the top of said back adjacent said bottom wall and said air exhaust opening is formed at the top of said back adjacent said top wall and wherein said bottom and top walls are shaped to guide airflow from said air intake opening up through said main chamber and past said circuit components and then out through said air exhaust opening.

10. The electronic cabinet of claim 4, wherein for each said cabinet section, said air exhaust opening opens into said chimney.

11. The electronic cabinet of claim 4, wherein for each said cabinet section, said at least one circuit breaker includes a plurality of sets of circuit breakers equal in number to the number of said control circuit modules, each said set of circuit breakers being located in front of and adjacent to a respective one of said control circuit modules such that each control circuit module has a respective set of circuit breakers associated therewith.

12. The electronic cabinet of claim 11, wherein for each said cabinet section, each said control circuit module includes at least one pigtail lead extending therefrom to a respective one of said circuit breakers forming part of the set of circuit breakers associated therewith.

13. An electronic cabinet, comprising:

a main chamber including a front wall and a back wall;

at least one control circuit module including a plurality o circuit components and a plurality of heat fins, said circuit components including at least one heat-producing element which is thermally coupled to said heat fins, each of said circuit control modules being coupled to said back wall at a respective location on said back wall with said circuit components located inside said chamber and said heat fins located outside said chamber and to the rear of said back wall;

an air intake opening formed in said front wall and an air exhaust opening formed in said back wall, the relative location of said air intake opening, said air exhaust opening and said circuit components being such that cool air enters said chamber through said air intake opening, passes over said circuit components and exits said chamber through said air exhaust opening by natural connection as the air in said chamber is heated by said at least one heat-producing element. said air exhaust opening being located above said heat fins so that air heated by said heat fins will rise past said air exhaust opening and cause additional air flow through said chamber;

further including a plurality of sets of circuit breakers, said sets being equal in number to the number of said control circuit modules, each said set of circuit breakers being located in said chamber in front of and adjacent to a respective one of said control circuit modules such that each control circuit module has a respective set of circuit breakers associated therewith.

14. The electronic cabinet of claim 13, wherein each said control circuit module includes at least one pigtail lead extending therefrom to a respective one of said circuit breakers forming part of the set of circuit breakers associated therewith.

* * * * *